United States Patent [19]
Koshikawa et al.

[11] Patent Number: 6,122,207
[45] Date of Patent: Sep. 19, 2000

[54] SEMICONDUCTOR MEMORY DEVICE AND METHOD FOR RELIEVING DEFECTIVE MEMORY CELLS

[75] Inventors: Yasuji Koshikawa; Tomoko Nobutoki; Kouji Mine, all of Tokyo, Japan

[73] Assignee: NEC Corporation, Tokyo, Japan

[21] Appl. No.: 09/268,994

[22] Filed: Mar. 16, 1999

[30] Foreign Application Priority Data

Apr. 30, 1998 [JP] Japan ................... 10-121369

[51] Int. Cl.$^7$ ................. G11C 7/00; G11C 8/00
[52] U.S. Cl. ..................... 365/200; 365/230.03
[58] Field of Search ................... 365/200, 201, 365/230.03, 230.5, 230.06

[56] References Cited

U.S. PATENT DOCUMENTS

| | | | |
|---|---|---|---|
| 4,918,662 | 4/1990 | Kondo ................... | 365/200 |
| 5,377,146 | 12/1994 | Reddy et al. ........... | 365/200 |
| 5,675,543 | 10/1997 | Rieger ................... | 365/200 |
| 5,701,270 | 12/1997 | Mohan Rao ........... | 365/230.03 |
| 5,822,257 | 10/1998 | Ogawa ................... | 365/200 |

FOREIGN PATENT DOCUMENTS

| | | |
|---|---|---|
| 5-217396 | 8/1993 | Japan . |
| 6-236700 | 8/1994 | Japan . |
| 9-106697 | 4/1997 | Japan . |

*Primary Examiner*—Andrew Tran
*Assistant Examiner*—Anh Phung
*Attorney, Agent, or Firm*—Young & Thompson

[57] ABSTRACT

A semiconductor memory device includes a plurality of memory cell groups, the data for the plurality of memory cell groups being transmitted through mutually different buses, and a redundancy memory cell group common to the plurality of memory cell groups. The semiconductor memory device further includes a control circuit for transmitting data for one or more memory cells of the redundancy memory cell group in place of data for one or more defective memory cells in any of the plurality of memory cell groups. Each of the plurality of memory cell groups is provided corresponding to every different input/output terminal of the memory device, or the plurality of memory cell groups are provided corresponding to a common input/output terminal of the memory device.

20 Claims, 7 Drawing Sheets

SEMICONDUCTOR MEMORY DEVICE AND METHOD FOR RELIEVING DEFECTIVE MEMORY CELLS

FIELD OF THE INVENTION

The present invention relates to a semiconductor memory device and a method for relieving defective memory cells in a semiconductor memory device. More particularly, the present invention relates to relieving defective memory cells in a plurality of memory cell arrays by using a redundancy memory cell array commonly provided for the plurality of memory cell arrays.

BACKGROUND OF THE INVENTION

As manufacturing process of a semiconductor integrated circuit device, including a semiconductor memory device, becomes more refined, defective memory cells in a memory device are more frequently replaced with redundancy memory cells, so that it becomes necessary to increase the number of redundancy memory cells. If the number of redundancy memory cells increases, however, a chip area increases, as well. It is, therefore, of importance to elaborate a more effective method for replacing a defective memory cell with a redundancy memory cell and to enhance efficiency. According to conventional techniques, a group of redundancy memory cells is individually allotted to each of memory cell groups to be read or written through different buses, respectively.

FIG. 6 is a block diagram showing a structure of a semiconductor memory device according to a conventional technique. In FIG. 6, a semiconductor memory device comprises DQ1 normal cell array 100, DQ2 normal cell array 200, DQ1R redundancy cell array 110, and DQ2R redundancy cell array 210. In this case, symbols DQ1i/o and DQ2i/o designate input/output terminals. The DQ1 normal cell array 100 and DQ1R redundancy cell array 110 correspond to the input/output terminal DQ1i/o. Also, the DQ2 normal cell array 200 and DQ2R redundancy cell array 210 correspond to the input/output terminal DQ2i/o. In the semiconductor memory device according to the conventional technique, one redundancy cell array is provided for each normal cell array.

The semiconductor memory device of FIG. 6 further comprises an input/output circuit 41, a data amplifier 33, a write amplifier 35, a column decoder 37, an input/output circuit 42, a data amplifier 34, a write amplifier 36, a redundancy column decoder 40, a column decoder 38 and a redundancy control circuit 43.

FIG. 7 is a timing chart for describing the operation of the conventional semiconductor memory device shown in FIG. 6. In the first to fourth clock cycles, wherein each clock cycle is determined by an internal clock signal ICLK produced from an external clock signal, potential level of column switch lines YSW11~YSW1n and column switch lines YSW21~YSW2n change in accordance with inputted column addresses YADD, as shown in FIG. 7. In each cycle, potential level of one of each of a plurality of column switch lines inputted to the DQ1 normal cell array 100 and DQ2 normal cell array 200, respectively, is activated. In sense amplifiers connected to the activated column switch line, data is transmitted to and from local input/output buses LIOBUS11~LIOBUS1m in accordance with data signal amplified by the sense amplifiers.

Assuming that the column address YADD provided in the second cycle is a column address of a column including one or more defective cells in the DQ1 normal cell array, DQ1R column redundancy selection signal YREDDQ1 becomes an active level (H). Also, assuming that the column address YADD provided in the fourth cycle is a column address of a column including one or more defective cells in the DQ2 normal cell array, DQ2R column redundancy selection signal YREDDQ2 becomes an active level (H).

In this case, in the second cycle, a redundancy column switch line RYSW1 is selected in response to the DQ1R column redundancy selection signal YREDDQ1, and data is transmitted to and from redundancy local input/output buses LIOBUS11~LIOBUS1m in sense amplifiers connected to the redundancy column switch line RYSW1 in accordance with data signals amplified by the sense amplifiers. In the fourth cycle, a redundancy column switch line RYSW2 is selected in response to the DQ2 column redundancy selection signal YREDDQ2, and data is transmitted to and from local input/output buses LIOBUS21~LIOBUS2m in sense amplifiers connected to the redundancy column switch line RYSW2 in accordance with data signals amplified by the sense amplifiers.

Accordingly, the data of global input/output buses GIOBUS1 and GIOBUS2 are transmitted to read/write buses RWBUS1 and RWBUS2, respectively in the first cycle; the data of a redundancy global input/output bus RGIOBUS1 and that of the global input/output bus GIOBUS2 are transmitted thereto, respectively in the second cycle; the data of the global input/output buses GIOBUS1 and GIOBUS2 are transmitted thereto, respectively in the third cycle; and the data of the global input/output bus GIBUS1 and that of the redundancy input/output bus RGIBUS2 are transmitted thereto, respectively in the fourth cycle.

According to the conventional technique, different redundancy memory cell groups are allotted to memory cell groups to be read or written through different buses, respectively. Owing to this, the conventional technique has a disadvantage in that probability of relief greatly decreases if the number of defective memory cells increase in at least one of the memory cell groups.

SUMMARY OF THE INVENTION

In these circumstances, the present invention has been made. It is therefore an object of the present invention to improve the yield of a semiconductor memory device.

It is another object of the present invention to provide a semiconductor memory device capable of increasing the relief probability of defective memory cells.

It is still another object of the present invention to provide a semiconductor memory device wherein redundancy memory cells are efficiently used to relieve defective memory cells.

It is still another object of the present invention to provide a semiconductor memory device wherein a large number of defective memory cells can be relieved by using a small number of redundancy memory cells.

It is still another object of the present invention to provide a semiconductor memory device wherein redundancy memory cells do not occupy large area on an integrated circuit memory chip and, therefore, chip area thereof can be efficiently used.

According to one aspect of the present invention, there is provided a semiconductor memory device comprising: a plurality of memory cell groups, wherein data for said plurality of memory cell groups being transmitted through mutually different buses; and a redundancy memory cell group common to said plurality of memory cell groups. The semiconductor memory device further comprises a control circuit portion for transmitting data for one or more memory cells of said redundancy memory cell group in place of data for one or more defective memory cells in any of said plurality of memory cell groups.

According to another aspect of the present invention, in the semiconductor memory device mentioned above, data for said plurality of memory cell groups is transmitted through mutually different buses in a first section, said first section being a part of a path for reading or writing said plurality of memory cell groups; and said control circuit portion transmits data for each of said plurality of memory cell groups and data for said redundancy memory cell group through a common bus in a second section, said second section being another part of the path for reading or writing said plurality of memory cell groups.

According to still another aspect of the present invention, there is provided a method for relieving defective memory cells in a semiconductor memory device comprising: providing a redundancy memory cell array corresponding to a plurality of memory cell arrays, wherein data for said plurality of memory cell arrays being transmitted through mutually different buses; and transmitting data for one or more memory cells of said redundancy memory cell array in place of data for one or more defective memory cells in any of said plurality of memory cell arrays.

According to still another aspect of the present invention, in the method mentioned above for relieving defective memory cells in a semiconductor memory device, data for said plurality of memory cell arrays being transmitted through mutually different buses in a first section, said first section being a part of a path for reading or writing said plurality of memory cell arrays; wherein said method further comprises determining whether an input column address coincides a column address of a defective column in one of said plurality of memory cell arrays; and in case said input column address coincides a column address of a defective column in one of said plurality of memory cell arrays, transmitting data of said redundancy memory cell array in place of the data of said defective column in one of said plurality of memory cell arrays through a bus common to said one of said plurality of memory cell arrays in a second section, said second section being another part of the path for reading or writing said plurality of memory cell arrays.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF THE PREFERRED EMBODIMENT

Embodiments of the present invention will now be described with reference to the accompanying drawings.

A. Structure of One Embodiment

Figure 1:
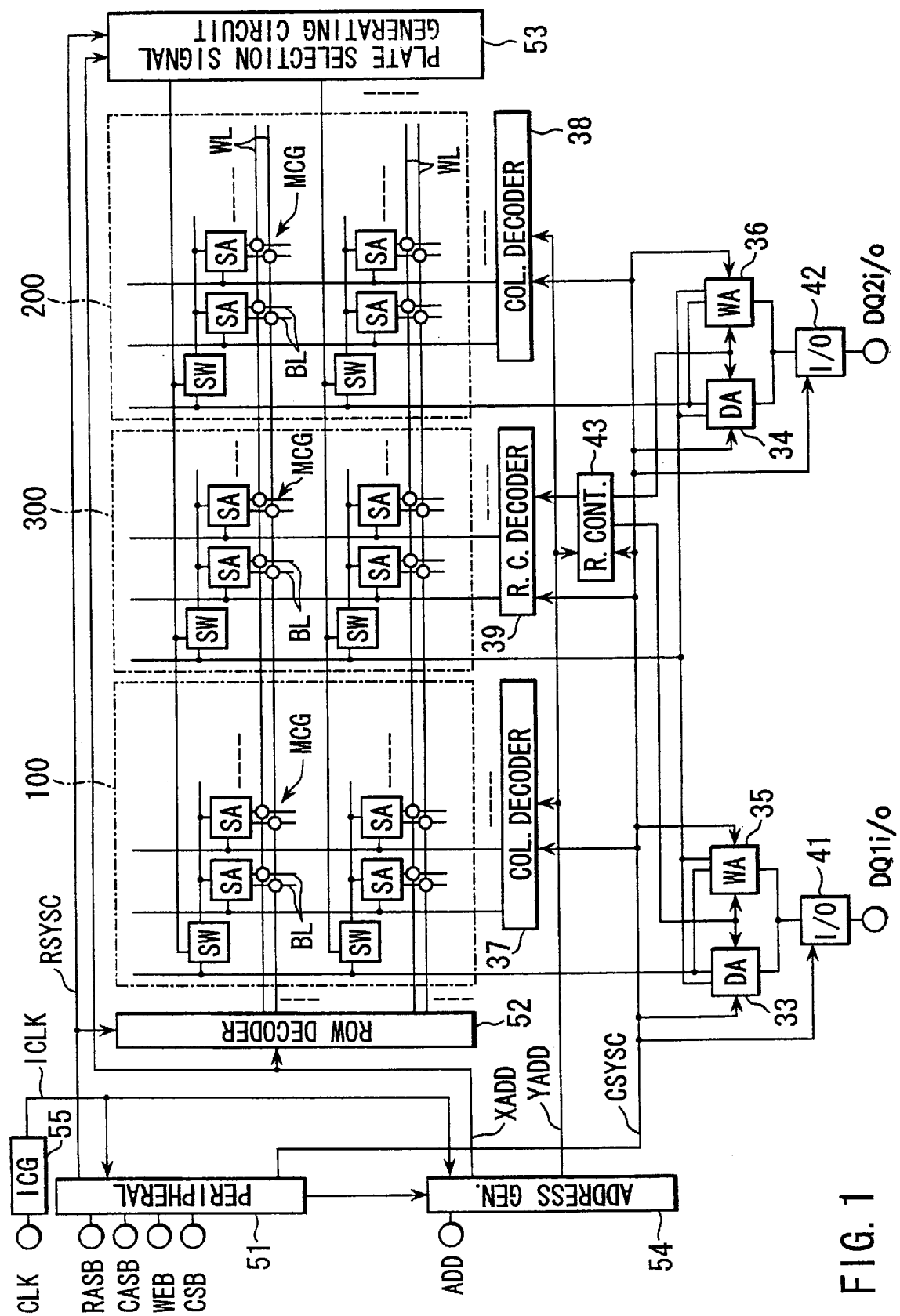
FIG. 1 is a block diagram showing a general structure of a semiconductor memory device according an embodiment of the present invention.

FIG. 1 is a block diagram showing a general structure of a semiconductor memory device according to an embodiment of the present invention. As shown in FIG. 1, the semiconductor memory device comprises a DQ1 normal cell array 100, a DQ2 normal cell array 200, a DQ1/2 redundancy cell array 300. DQ1i/o and DQ2i/o designate input/output terminals of the semiconductor memory device. The DQ1 normal cell array 100 corresponds to the input/output terminal DQ1i/o. The DQ2 normal cell array 200 corresponds to the input/output terminal DQ2i/o. The DQ1/2 redundancy cell array 300 corresponds to both the input/output terminals DQ1i/o and DQ2i/o.

Also, the semiconductor memory device comprises a peripheral circuit 51, a row decoder 52, a plate selection signal generating circuit 53, an address generating circuit 54, and an internal clock generating circuit (ICG) 55. The peripheral circuit 51 is an interface circuit which receives several control signals, such as a row address strobe signal RASB, a column address strobe signal CASB, a write enable signal WEB, and a chip select signal CSB, and generates internal control signals such as row system control signal RSYSC and column system control signal CSYSC. Operation, structure and function of the peripheral circuit 51 are easily understood by those of ordinary skill in the art. The address generating circuit 54 receives an external address signal ADD and generates a column address signal YADD and a row address signal XADD. The plate selection signal generating circuit 53 accepts one or more upper bits of the row address signal XADD from the address generating circuit 54 and generates plate selection signals PSEL1 through PSELm. The row decoder 52 accepts lower bits of the row address signal XADD from the address generating circuit 54 and generates word line selection signals supplied to word lines WL. The internal clock generating circuit 55 receives an external clock signal CLK, and performs buffering, timing adjustment, and the like to generate an internal clock signal ICLK. The internal clock signal ICLK are supplied to the peripheral circuit 51 and to the address generating circuit 54.

The semiconductor memory device further comprises an input/output circuit 41, a data amplifier 33, a write amplifier 35, a column decoder 37, an input/output circuit 42, a data amplifier 34, a write amplifier 36, a column decoder 38, a redundancy column decoder 39 and a redundancy control circuit 43.

Figure 2:
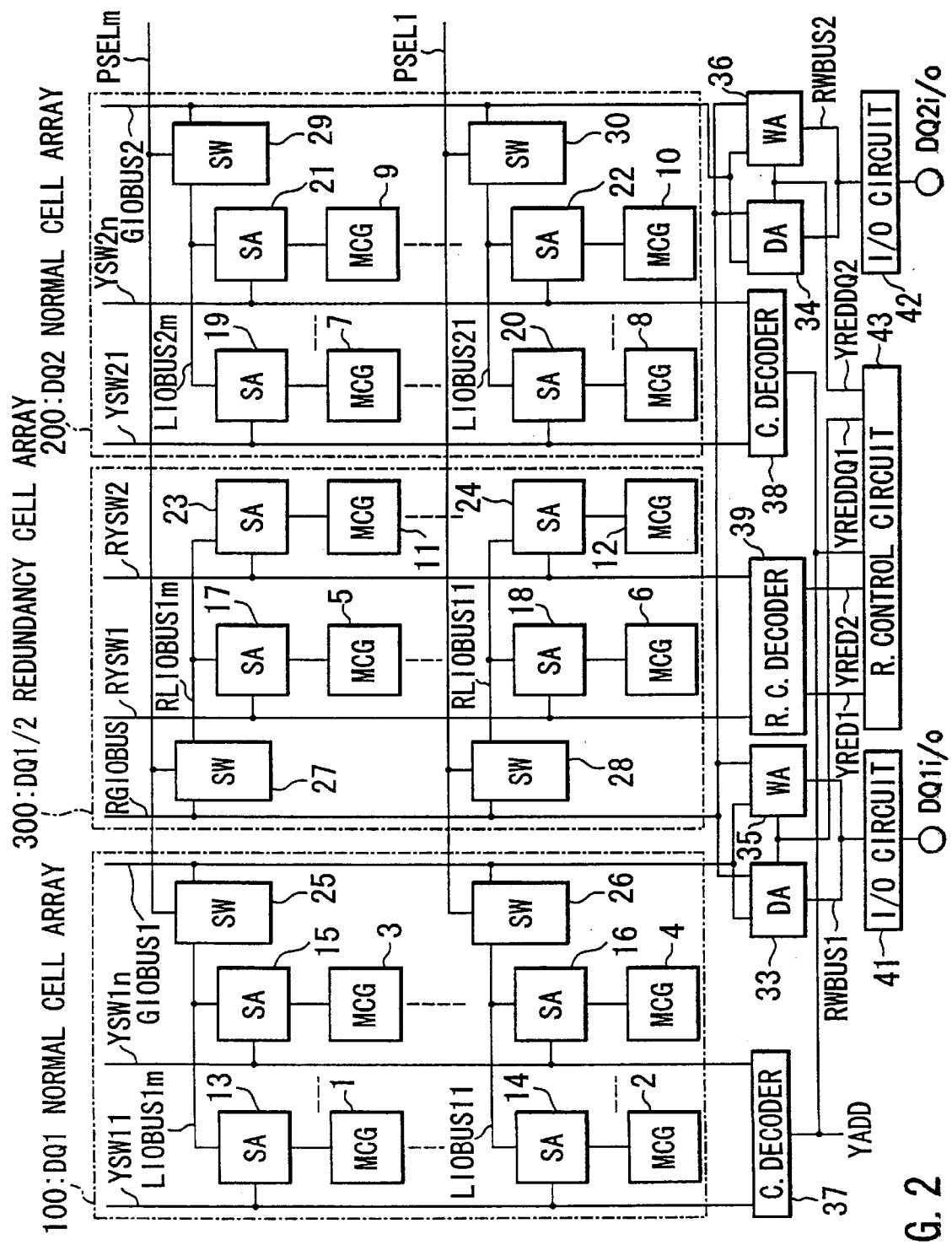
FIG. 2 is a partial block diagram showing a detailed structure of a semiconductor memory device illustrated in FIG. 1.

FIG. 2 is a partial block diagram showing the detailed structure of the semiconductor memory device illustrated in FIG. 1. As shown in FIG. 2, the DQ1 normal cell array 100 comprises a plurality of (n) column switch lines YSW11~YSW1n connected to the column decoder 37, a global input/output bus GIOBUS1 connected to the data amplifier 33 and the write amplifier 35, and a plurality of (m) plate selection signal lines PSEL1~PSELm connected to the plate selection signal generating circuit 53 (FIG. 1). The DQ1 normal cell array 100 further comprises a plurality of sense amplifiers (SA) 13, 14, 15 and 16 each connected to the column switch lines YSW11~YSW1n of a corresponding column, a plurality of memory cell groups 1, 2, 3 and 4 each connected to a corresponding one of the sense amplifiers (SA) via bit lines BL (FIG. 1), a plurality of (m) switch circuits 25 and 26, and a plurality of (m) local input/output buses LIOBUS11~LIOBUS1m. Each of the switch circuits 25 and 26 is connected between the global input/output bus GIOBUS1 and a corresponding one of the local input/output buses LIOBUS11~LIOBUS1m. Each of the switch circuits 25 and 26 is also connected to a corresponding one of the plate selection lines PSELm~PSEL1, and is on/off controlled by a plate selection signal supplied from the corresponding one of the plate selection lines PSELm~PSEL1.

The DQ2 normal cell array 200 comprises a plurality of (n) column switch lines YSW21~YSW2n connected to the column decoder 38, a global input/output bus GIOBUS2 connected to the data amplifier 34 and the write amplifier 36, and a plurality of (m) plate selection signal lines PSEL1~PSELm connected to the plate selection signal generating circuit 53 (FIG. 1). The DQ2 normal cell array 200 further comprises a plurality of sense amplifiers (SA) 19, 20, 21 and 22 each connected to the column switch lines YSW21~YSW2n of a corresponding column, a plurality of memory cell groups 7, 8, 9 and 10 each connected to a corresponding one of the sense amplifiers (SA) via bit lines BL (FIG. 1), a plurality of (m) switch circuits 29 and 30, and a plurality of (m) local input/output buses LIOBUS21~LIOBUS2m. Each of the switch circuits 29 and 30 is connected between the global input/output bus GIOBUS2 and a corresponding one of the local input/output buses LIOBUS21~LIOBUS2m. Each of the switch circuits 29 and 30 is also connected to a corresponding one of the plate selection lines PSELm~PSEL1, and is on/off controlled by a plate selection signal supplied from the corresponding one of the plate selection lines PSELm~PSEL1.

The DQ1/2 redundancy cell array 300 comprises, for example, two redundancy column switch lines RYSW1~RYSW2 connected to the redundancy column decoder 39, a common redundancy global input/output bus RGIOBUS connected to the data amplifier 33 and the write amplifier 35 and further to the data amplifier 34 and the write amplifier 36, and a plurality of (m) plate selection signal lines PSEL1~PSELm connected to the plate selection signal generating circuit 53 (FIG. 1). Although two redundancy column switch lines is shown in FIG. 2 for the sake of simplicity, it should be noted that the number of the redundancy column switch lines, thus the number of redundancy columns, can be any number depending on the required relief probability and the like. The DQ1/2 redundancy cell array 300 further comprises a plurality of sense amplifiers (SA) 17, 18, 23 and 24 each connected to the redundancy column switch lines RYSW1~RYSW2 of a corresponding column, a plurality of redundancy memory cell groups 5, 6, 11 and 12 each connected to a corresponding one of the sense amplifiers (SA) via bit lines BL (FIG. 1), a plurality of (m) switch circuits 27 and 28, and a plurality of (m) redundancy local input/output buses RLIOBUS11~RLIOBUS1m. Each of the switch circuits 27 and 28 is connected between the redundancy global input/output bus RGIOBUS and a corresponding one of the redundancy local input/output buses RLIOBUS11~RLIOBUS1m. Each of the switch circuits 27 and 28 is also connected to a corresponding one of the plate selection lines PSELm~PSEL1, and is on/off controlled by a plate selection signal supplied from the corresponding one of the plate selection lines PSELm and PSEL1.

The data amplifier 33 has data inputs connected to the global input/output bus GIOBUS1 and the redundancy global input/output bus RGIOBUS, and accepts data signal from either of these buses. The data amplifier 33 also has a signal input for receiving a DQ1 column redundancy selection signal YREDDQ1 which selects either of the data signals from the global input/output bus GIOBUS1 or the redundancy global input/output bus RGIOBUS for inputting to the data amplifier 33. An output terminal of the data amplifier 33 is connected to the read/write bus RWBUS1 to output data signal thereto.

The write amplifier 35 has data outputs connected to the global input/output bus GIOBUS1 and the redundancy global input/output bus RGIOBUS, and outputs data signal to either of these buses. The write amplifier 35 also has a signal input for receiving the DQ1 column redundancy selection signal YREDDQ1 which also selects data output path of data signal into the global input/output bus GIOBUS1 or the redundancy global input/output bus RGIOBUS from the write amplifier 35. An input terminal of the write amplifier 35 is connected to the read/write bus RWBUS1 to receive data signal therefrom.

The input/output circuit 41 is connected between an external input/output terminal DQ1i/o and a read/write bus RWBUS1 and functions as an interface circuit therebetween.

The column decoder 37 receives the column address signal YADD from the address generating circuit 54 (FIG. 1) and outputs a plurality of (n) column switch signals to the column switch lines YSW11~YSW1n. The column switch signals are obtained by decoding the column address signal YADD and are used for selecting a column of the DQ1 normal cell array 100.

The data amplifier 34 has data inputs connected to the global input/output bus GIOBUS2 and the redundancy global input/output bus RGIOBUS, and accepts data signal from either of these buses. The data amplifier 34 also has a signal input for receiving a DQ2 column redundancy selection signal YREDDQ2 which selects either of the data signals from the global input/output bus GIOBUS2 or the redundancy global input/output bus RGIOBUS for inputting to the data amplifier 34. An output terminal of the data amplifier 34 is connected to the read/write bus RWBUS2 to output data signal thereto.

The write amplifier 36 has data outputs connected to the global input/output bus GIOBUS2 and the redundancy global input/output bus RGIOBUS, and outputs data signal to either of these buses. The write amplifier 36 also has a signal input for receiving the DQ2 column redundancy selection signal YREDDQ2 which also selects data output path of data signal into the global input/output bus GIOBUS2 or the redundancy global input/output bus RGIOBUS from the write amplifier 36. An input terminal of the write amplifier 36 is connected to the read/write bus RWBUS2 to receive data signal therefrom.

The input/output circuit 42 is connected between an external input/output terminal DQ2i/o and a read/write bus RWBUS2 and functions as an interface circuit therebetween.

The column decoder 38 receives the column address signal YADD from the address generating circuit 54 (FIG. 1) and outputs a plurality of (n) column switch signals to the column switch lines YSW21~YSW2n. The column switch signals are obtained by decoding the column address signal YADD and are used for selecting a column of the DQ2 normal cell array 200.

The redundancy column decoder 39 receives as inputs the first column redundancy selection signal YRED1 and the second column redundancy selection signal YRED2 from the redundancy control circuit 43, and outputs redundancy column switch signals to the redundancy column switch lines RYSW1 and RYSW2.

The redundancy control circuit 43 receives the column address signal YADD from the address generating circuit 54 (FIG. 1), and outputs the first column redundancy selection signal YRED1 and the second column redundancy selection signal YRED2 supplied to the redundancy column decoder 39. The redundancy control circuit 43 also outputs the DQ1 column redundancy selection signal YREDDQ1 and the DQ2 column redundancy selection signal YREDDQ2 which are supplied to the data amplifier 33 and the write amplifier 35, and the data amplifier 34 and the write amplifier 36, respectively.

Figure 3:
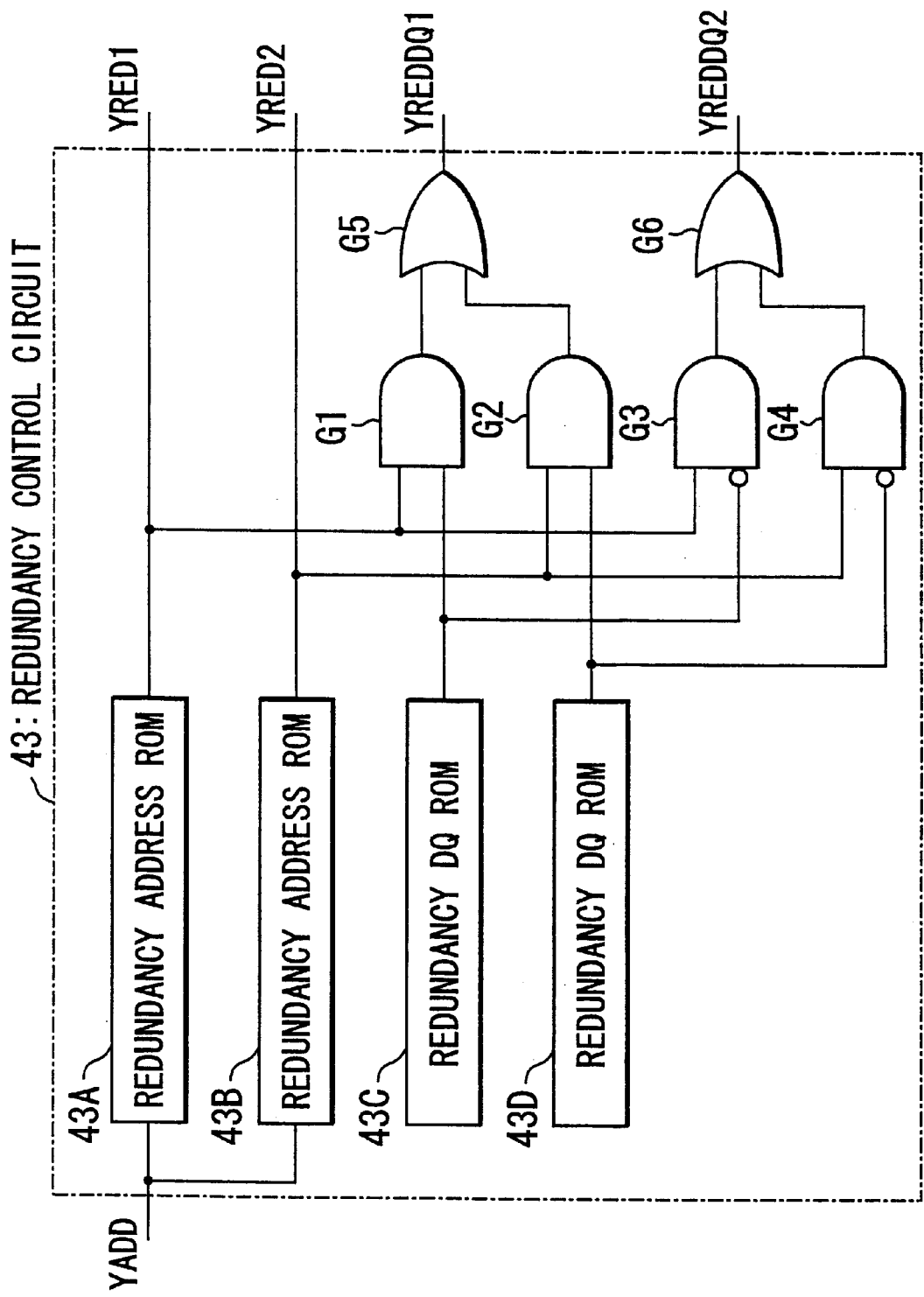
FIG. 3 is a partial block circuit diagram showing an example of a structure of a redundancy control circuit 43 used in the semiconductor memory device of FIG. 2.

In FIG. 3, a block diagram depicting an example of the structure of the above-stated redundancy control circuit 43 is illustrated. As illustrated in FIG. 3, the redundancy control circuit 43 comprises redundancy address ROM's 43A and 43B which receive the column address signal YADD and generate the first column redundancy selection signal YRED1 and the second column redundancy selection signal YRED2, respectively. The redundancy addresses ROM 43A stores a column address of a defective column in the DQ1 normal cell array 100, and generates, i.e., activates the first column redundancy selection signal YRED1 when the input column address signal YADD coincides the stored column address. The redundancy addresses ROM 43B stores a column address of a defective column in the DQ2 normal cell array 200, and generates, i.e., activates the second column redundancy selection signal YRED2 when the input column address signal YADD coincides the stored column address. The redundancy address ROM is provided corresponding to each column of the redundancy memory cell array 300. Also, as another structure, each of the column redundancy selection signals, such as the first and second column redundancy selection signals YRED1 and YRED2, may be a multi-bit address signal designating a column of the DQ1/2 redundancy cell array 300 used for replacing a defective column of the DQ1 normal cell array 100 or the DQ2 normal cell array 200.

The redundancy control circuit 43 further comprises redundancy DQ ROM's 43C and 43D. The redundancy DQ ROM's 43C and 43D are used to generate the DQ1 column redundancy selection signal YREDDQ1 and the DQ2 column redundancy selection signal YREDDQ2, indicating that a column of which normal cell array DQ1 or DQ2 is replaced by a column of the redundancy memory cell array 300. Each of the redunancy DQ ROM's 43C and 43D outputs a signal having a fixed logical level. The DQ ROM 43C corresponds to the DQ1 normal cell array 100 and the DQ ROM 43D corresponds to the DQ2 normal cell array 200.

The redundancy control circuit 43 further comprises a plurality of logic gates G1 to G6. The AND logic gate G1 obtains the logical product (logical AND) of the output YRED1 of the redundancy address ROM 43A and the output of the redundancy DQ ROM 43C. The AND logic gate G2 obtains the logical product of the output YRED2 of the redundancy address ROM 43B and the output of the redundancy DQ ROM 43D. The AND logic gate G3 obtains the logical product of the output YRED1 of the redundancy address ROM 43A and the inversion of the output of the redundancy DQ ROM 43C. The AND gate G4 obtains the logical product of the output YRED2 of the redundancy address ROM 43B and the inversion of the output of the redundancy DQ ROM 43D. The OR logic gate G5 obtains the logical sum (logical OR) of the outputs of the AND logic gate G1 and the AND logic gate G2. The OR logic gate G6 obtains the logical sum of the outputs of the AND logic gate G3 and the AND logic gate 4. The outputs of the OR logic gates G5 and G6 are outputted as the DQ1 column redundancy selection signal YREDDQ1 and the DQ2 column redundancy selection signal YREDDQ2, respectively.

B. Operation of the Embodiment

Figure 4:
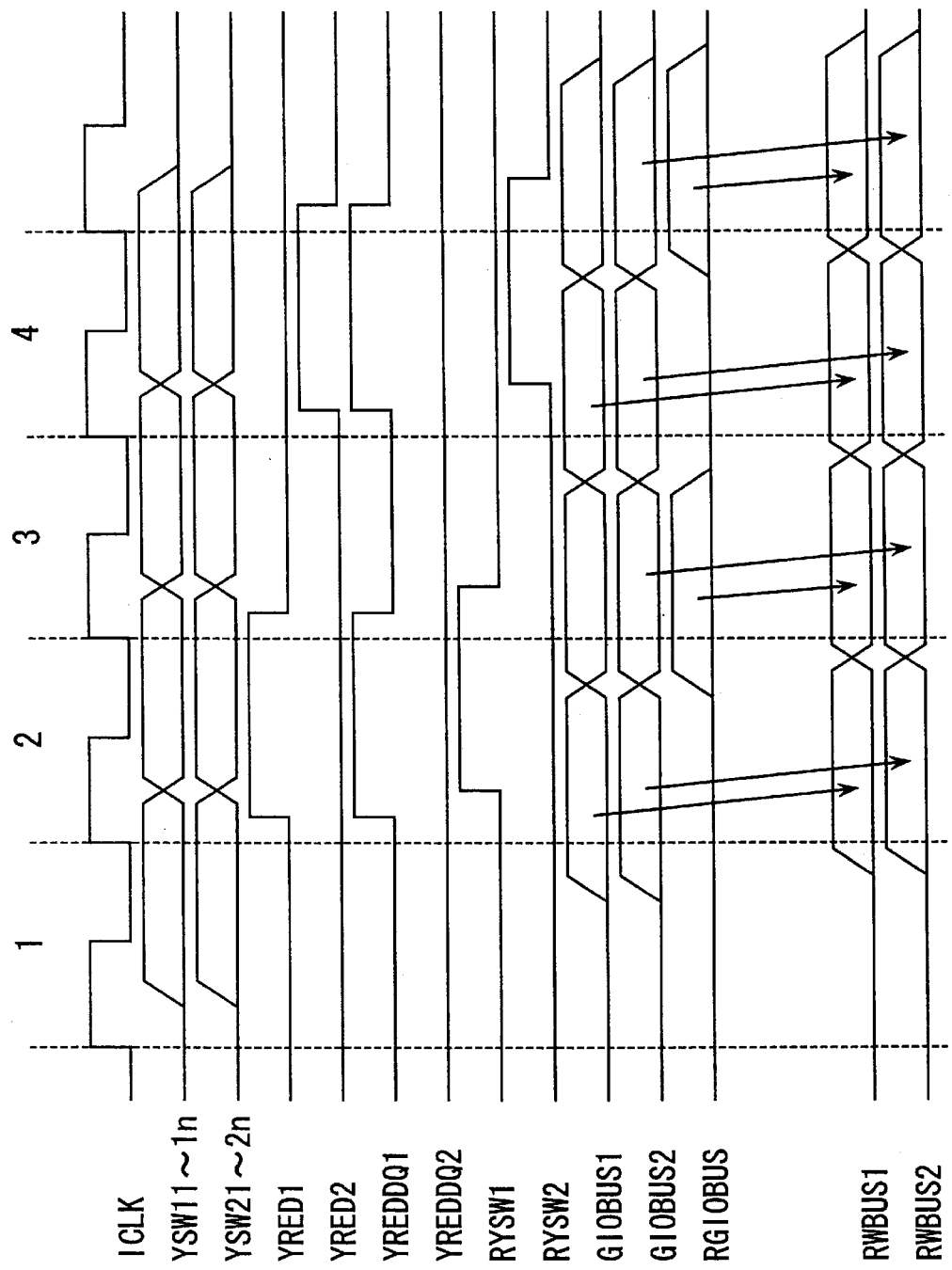
FIG. 4 is a timing chart for describing the operation of the semiconductor memory device according an embodiment of the present invention.

Next, the overall operation of the semiconductor memory device in this embodiment will be described in detail with reference to the timing chart of FIG. 4. In case of a synchronous type semiconductor memory device which operates synchronously with an external clock CLK, when a mode is set to, for example, a read mode, the column address YADD is produced within the address generating circuit 54 (FIG. 1) synchronously with a rising edge of the internal clock ICLK produced from the external clock CLK in the internal clock generating circuit (ICG) 55 (FIG. 1). In the example of FIG. 4, the column addresses YADD are sequentially produced in four cycles. Among them, it is assumed that the column address YADD produced in the second cycle is a column address corresponding to a defective column in the DQ1 normal cell array 100 which should be replaced by a redundancy column of the DQ1/2 redundancy cell array 300, and that the column address YADD produced in the fourth cycle is another column address corresponding to another defective column in the DQ1 normal cell array 100 which also should be replaced by a redundancy column of the DQ1/2 redundancy cell array 300.

In the first to fourth cycles, the column switch signals YSW11~YSW1n and the column switch signals YSW21~YSW2n change in accordance with the produced column addresses YADD. In each cycle, one of a plurality of column switch signals inputted to the DQ1 normal cell array 100 and one of a plurality of column switch signals inputted to the DQ2 normal cell array 200 are respectively activated. From the sense amplifiers connected to the activated column switch line, data are transmitted to the local input/output buses in accordance with the data written in memory cells selected by the word lines WL.

Also, one of a plurality of plate selection signals PSEL1~PSELm from the plate selection signal generating circuit 53 is activated in accordance with the row address XADD supplied from the address generating circuit 54. Due to this, one of a plurality of switch circuits of each of the DQ1 normal cell array 100 and the DQ2 normal cell array 200 is activated and the data of the local input/output bus connected to the activated switch circuit is transmitted to each of the global input/output bus GIOBUS1 and GIOBUS2.

Since the column address YADD produced in the second cycle is the column address in the DQ1 normal cell array 100 to be replaced, the DQ1 column redundancy selection signal YREDDQ1 becomes an active level (H) and the first column redundancy selection signal YRED1 becomes an active level (H). In addition, since the column address YADD produced in the fourth cycle is the column address in the DQ1 normal cell array 100 to be replaced, the DQ1 column redundancy selection signal YREDDQ1 becomes an active level (H) and the second column redundancy selection signal YRED2 becomes an active level (H).

Thus, in the second cycle, the redundancy column switch line RYSW1 is selected in response to the first column redundancy selection signal YRED1, and data is transmitted to the redundancy local input/output buses RLIOBUS11~RLIOBUS1m in accordance with the data written in memory cells selected by the word lines WL from the sense amplifiers connected to RYSW1. Besides, one of a plurality of plate selection signals PSEL1~PSELm is activated, so that the data of the redundancy local input/output bus connected to the activated switch circuit SW is transmitted to the redundancy global input/output bus RGIOBUS.

Further, in the fourth cycle, the redundancy column switch line RYSW2 is selected in response to the second column redundancy selection signal YRED2, and data is transmitted to the redundancy local input/output buses RLIOBUS11~RLIOBUS1m in accordance with the data written in the memory cells selected by the word lines WL from the sense amplifiers connected to RYSW2. Besides, the data of the redundancy local input/output bus connected to the switch circuit SW activated by the one of the plate selection signals PSEL1~PSELm is transmitted to the redundancy global input/output bus RGIOBUS.

The data amplifier 33 and write amplifier 35 are controlled such that if the DQ1 column redundancy selection signal YREDDQ1 is activated, data is not transmitted through the global input/output bus GIOBUS1 but can be transmitted through the redundancy global input/output bus RGIOBUS, and that if the DQ1 column redundancy selection signal YREDDQ1 is inactive, data is not transmitted through the redundancy global input/output bus RGIOBUS but can be transmitted through the global input/output bus GIOBUS1. The data amplifier 34 and the write amplifier 36 are controlled such that if the DQ2 column redundancy selection signal YREDDQ2 is activated, data is not transmitted through the global input/output bus GIOBUS2 but can be transmitted through the redundancy global input/output bus RGIOBUS, and that if the DQ2 column redundancy selection signal YREDDQ2 is inactive, data is not transmitted through the redundancy global input/output bus RGIOBUS but can be transmitted through the global input/output bus GIOBUS2.

Accordingly, the data of global input/output bus GIOBUS1 and GIOBUS2 are transmitted to the read/write buses RWBUS1 and RWBUS2, respectively, in the first cycle; the data of the redundancy global input/output bus RGIOBUS and that of the global input/output bus GIOBUS2 are transmitted thereto, respectively, in the second cycle; the data of the global input/output buses GIOBUS1 and GIOBUS2 are transmitted thereto, respectively, in the third cycle; and the data of the redundancy global input/output bus RGIOBUS and that of the global input/output bus GIOBUS2 are transmitted thereto, respectively, in the fourth cycle.

C. Another Embodiment

Another embodiment of the present invention will now be explained.

Figure 5:
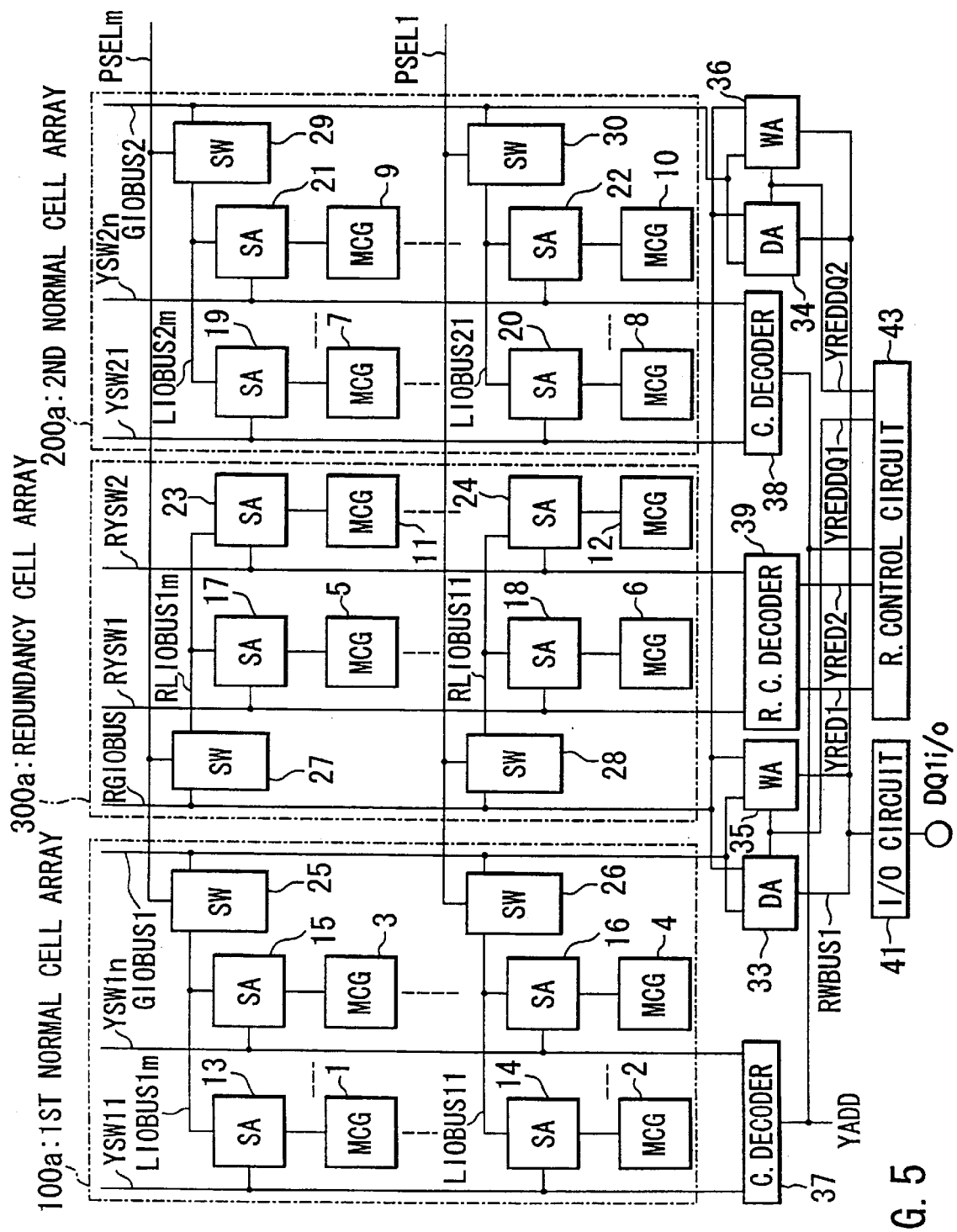
FIG. 5 is a partial block diagram showing a detailed structure of a semiconductor memory device according to another embodiment of the present invention.
Figure 6:
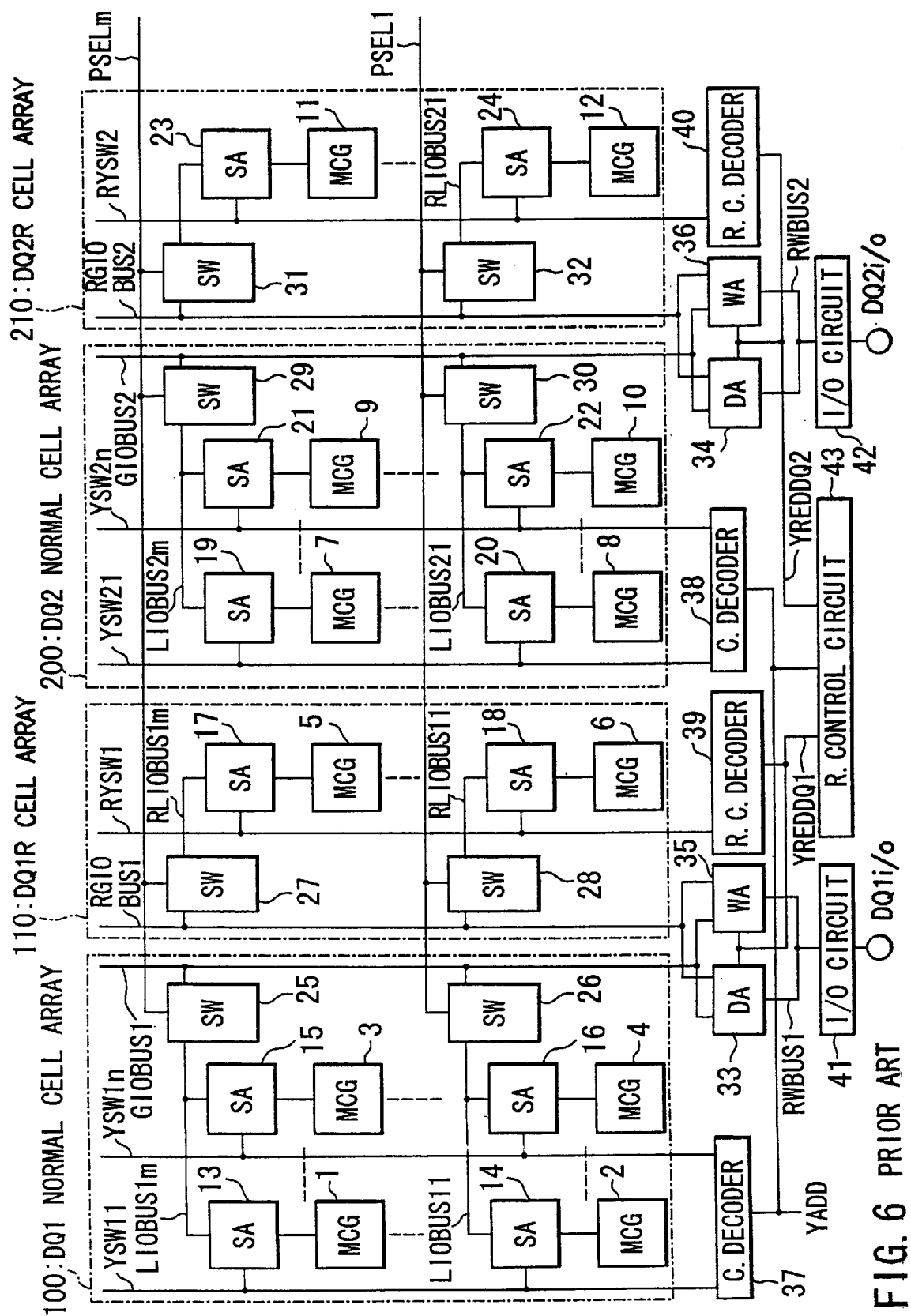
FIG. 6 is a block diagram showing a structure of a semiconductor memory device according to a conventional technique.
Figure 7:
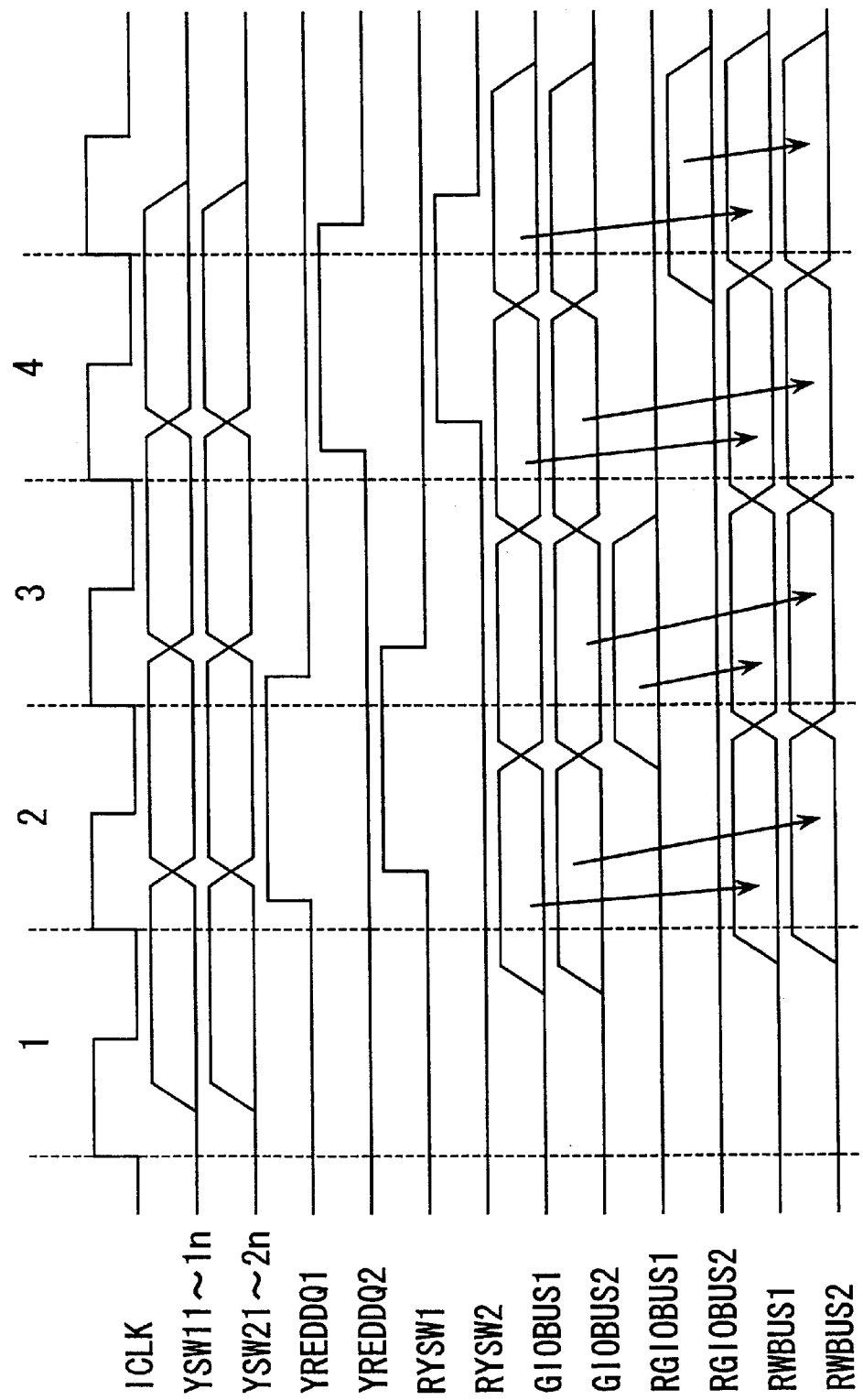
FIG. 7 is a timing chart for describing the operation of the semiconductor memory device according to the conventional technique illustrated in FIG. 6.

FIG. 5 is a block diagram showing the structure of a semiconductor memory device in another embodiment according to the present invention. In FIG. 5, elements corresponding to those in FIGS. 1 and 2 are denoted by the same reference symbols and are not explained here again. In this embodiment, the semiconductor memory device comprises the first normal cell array 100a instead of the DQ1 normal cell array 100 shown in FIGS. 1 and 2, the second normal cell array 200a instead of the DQ2 normal cell array 200, and a redundancy cell array 300a instead of the DQ1/2 redundancy cell array 300. In addition, the semiconductor memory device of FIG. 5 does not comprise an input/output circuit 42, a read/write bus RWBUS2, and an input/output terminal DQ2 shown in FIGS. 1 and 2. A data amplifier 34 and a write amplifier 36 are connected to an input/output circuit 41 through a read/write bus RWBUS1.

In the embodiment of FIGS. 1 and 2, a common redundancy cell array 300 is used for the normal cell arrays 100 and 200 corresponding to different input/output terminals DQ1i/o and DQ2i/o, whereas, in this embodiment, a common redundancy cell array 300a is used for the first normal cell array 100a and the second normal cell array 200a which are connected to different data amplifiers and write amplifiers that are connected to a single common input/output terminal DQ1i/o. As in the case of the embodiment of FIGS. 1 and 2, data is normally transmitted through different local input/output buses and global input/output buses. After a defective cell is replaced with a redundancy cell, data is transmitted through common redundancy local input/output buses and a column redundancy global input/output bus.

D. Advantages of Embodiments

Next, advantages of the above-stated embodiments will be described.

Consider, as an example, a case where, in the structure of FIGS. 1 and 2, column address space is Y=0 to 255, the number of normal cell arrays is two, that is, 256 column switch lines are provided for each of the DQ1 normal cell array and DQ2 normal cell array, and four redundancy column switch lines, that is four spare columns, are prepared as a whole.

In the conventional technique, two spares are allotted to each of the DQ1 normal cell array and DQ2 normal cell array, in such constitution. At this time, the relief probability Q1 when there is one defective column line as a whole and the relief probability Q2 when there are two defective lines as a whole are obviously both 100%. To relieve three defective lines, one defective line and two defective lines must be allotted to DQ1 normal cell array and DQ2 normal cell array, respectively, and vice versa. Thus, in this case, the relief probability Q3 is:

$$Q3=(1-2/2^3)\times 100=75(\%).$$

Likewise, when there are four defective lines, probability Q4 is:

$$Q4=\{1-(_4C_2)/2^4\}\times 100=37.5(\%).$$

Further, when there are five or more defective lines, relief probability is obviously 0%.

Meanwhile, according to the present invention, four spares can be used for both DQ1 normal cell array and DQ2 normal cell array. When there is one defective line as a whole, the probability R1 is obviously 100%. As for probability R2 at which two defective lines are relieved, however, it is necessary to suppose that, if the one of the two defective lines is for DQ1 normal cell array while the other is for DQ2 normal cell array and they have the same column address, the defective lines are not relieved. This is because only one redundancy global input/output bus is prepared for DQ1 normal cell array and DQ2 normal cell array and data collide against each other when accessed simultaneously through DQ1 normal cell array and DQ2 normal cell array.

Due to this, the probability R2 is:

$$R2=\{1-1/(512-1)\}\times 100=99.998(\%).$$

Relief probabilities R3 and R4 when there are three and four defective lines as a whole, respectively are:

$$R3=\{1-1/(512-1)\}\times _3C_1\times 100=99.414(\%);$$

and $$R4=\{1-1/(512-1)\}\times _4C_2\times 100=98.826(\%).$$

Needless to say, when the number of defective lines is five or more as a whole, the relief probability is 0%.

As can be understood from the above, when the number of defective lines are three and four, relief probabilities are greatly improved from those of the conventional memory device. When the number of defective lines is two, the relief probability is slightly lower than the probability of the conventional memory device. However, improvements at the time of three and four defective lines are much higher and, as a whole, greater advantage can thus be expected in the present invention.

As described above, according to the present invention, a common redundancy memory cell array is provided for a plurality of memory cell arrays to be read or written through different buses, and a common bus is used for reading or writing the redundancy memory cell array. Also, data for each of the plurality of memory cell arrays and data for the common redundancy memory cell array are transmitted through a common bus between, for example, the data amplifier/the write amplifier and the input/output terminal. Thus, it is possible to efficiently utilize the redundancy memory cells, and to advantageously increase the relief probability of defective memory cells.

In the foregoing specification, the invention has been described with reference to specific embodiments. However, one of ordinary skill in the art appreciates that various modifications and changes can be made without departing from the scope of the present invention as set forth in the claims below. For example, in the above embodiments, one redundancy memory cell array is provided for two normal cell arrays. However, one redundancy memory cell array can be used to relief more than two normal cell arrays. Also, it is possible to provide a plurality of redundancy memory cell arrays each corresponding to a set of normal cell arrays. Accordingly, the specification and figures are to be regarded in an illustrative sense rather than a restrictive sense, and all such modifications are intended to be included within the scope of the present invention. Therefore, it is intended that this invention encompasses all of the variations and modifications as fall within the scope of the appended claims.

What is claimed is:

1. A semiconductor memory device comprising:
   plural memory cell arrays, each memory cell array having plural memory cell groups, each of said memory cell groups being connected via a local bus to a cell array global bus line commonly shared by each of said memory cell groups of each memory cell array;
   a redundancy memory cell array with a redundancy cell array global bus line, said redundancy memory cell array having plural redundancy memory cell groups, each of said redundancy memory cell groups being connected via a local bus to said redundancy cell array global bus line,
   said redundancy memory cell array being shared by at least two memory cell arrays; and
   a control circuit connected to said redundancy cell array and said two memory cell arrays for transmitting data for one or more memory cells of said redundancy memory cell groups in place of data for one or more defective memory cells in any of said plural memory cell groups of said two memory cell arrays.

2. The semiconductor memory device of claim 1, wherein:
   said control circuit is connected to said redundancy memory cell array and said two memory cell arrays by a first section comprising said redundancy cell array global bus line and two cell array global bus lines, each one of said two cell array global bus lines corresponding to one of said two memory cell arrays.

3. The semiconductor memory device of claim 2, wherein:
   said redundancy cell array global bus line is switchable connected to each local bus line of said redundancy cell array; and
   each of said two cell array global bus lines is switchable connected to each local bus line of said corresponding memory cell array.

4. The semiconductor memory device of claim 1, wherein:
   said redundancy cell array global bus line and two of said cell array global bus lines connect to said control circuit to form a first section for transmitting data through mutually different of said redundancy cell array global bus line and said two cell array global bus lines to one of said two memory cell arrays and said redundancy memory cell array; and
   said control circuit is further connected to a second section for transmitting data for both said redundancy memory cell array and one of said two memory cell arrays through a common bus.

5. The semiconductor memory device of claim 1, wherein:
   each of said redundancy memory cell groups is connectable to every input/output terminal associated with said two memory cell arrays.

6. The semiconductor memory device of claim 1 wherein:
   each of said memory cell groups and said redundancy memory cell groups is connectable to a common input/output terminal.

7. The semiconductor memory device of claim 4, wherein:
   a first memory cell group of a first of said two memory cell arrays is connected to a first input/output terminal and a second memory cell group of a second of said two memory cell arrays is commonly connected to said first input/output terminal;
   when memory cells of said first memory cell group are replaced with memory cells of said redundancy memory cell array, data of said memory cells of said redundancy memory cell array is controlled to be transmitted through a bus common to said first memory cell group in said second section; and
   when memory cells of said second memory cell group are replaced with memory cells of said redundancy memory cell array, data of said memory cells of said redundancy memory cell array is controlled to be transmitted through a bus common to said second of said memory cell groups in said second section.

8. The semiconductor memory device of claim 4, wherein:
   a first of said memory cell groups is connected to a first input/output terminal and a second of said memory cell groups is connected to a second input/output terminal;
   when memory cells of said first of said memory cell groups are replaced with memory cells of said redundancy memory cell array, data of said memory cells of said redundancy memory cell array is controlled to be transmitted through a bus common to said first of said memory cell groups in said second section; and
   when memory cells of said second of said memory cell groups are replaced with memory cells of said redundancy memory cell array, data of said memory cells of said redundancy memory cell array is controlled to be transmitted through a bus common to said second of said memory cell groups in said second section.

9. A semiconductor memory device comprising:

a bus selecting circuit coupled to a redundancy cell array global bus line, to a first memory cell array global bus line, and to a second memory cell array global bus line;

said first memory cell array global bus line being further switchable connected at plural points to a first memory cell array, said first memory cell array having plural memory cell groups, each of said memory cell groups being connected via a local bus to said first memory cell array global bus line;

said second memory cell array global bus line being further switchable connected at plural points to a second memory cell array, said second memory cell array having plural memory cell groups, each of said memory cell groups being connected via a local bus to said second memory cell array global bus line;

said redundancy memory cell array global bus line being further connected at plural points to a redundancy memory cell array, said redundancy memory cell array having plural redundancy memory cell groups, each of said redundancy memory cell groups being connected via a local bus to said redundancy memory cell array global bus line;

said redundancy memory cell array being shared by said first and second memory cell arrays; and said bus selecting circuit cell being controllable for transmitting data for one or more memory cells of said redundancy memory cell groups in place of data for one or more defective memory cells in any of said plural memory cell groups of said first and second memory cell arrays.

10. The semiconductor memory device of claim 9, wherein:

said bus selecting circuit comprises a first data amplifier, a first write amplifier, a second data amplifier, and a second write amplifier, said first data amplifier and said first write amplifier are connected to said redundancy cell array global bus line and to said first memory cell array global bus line, said second data amplifier and said second write amplifier are connected to said redundancy cell array global bus line and to said second memory cell array global bus line, said first data amplifier and said first write amplifier are connected to a first input/output terminal, and said second data amplifier and said second write amplifier are connected to second input/output terminal.

11. The semiconductor memory device of claim 9, wherein:

said bus selecting circuit comprises a first data amplifier, a first write amplifier, a second data amplifier, and a second write amplifier, said first data amplifier and said first write amplifier are connected to said redundancy cell array global bus line and to said first memory cell array global bus line, said second data amplifier and said second write amplifier are connected to said redundancy cell array global bus line and to said second memory cell array global bus line, and said first data amplifier, said first write amplifier, said second data amplifier, and said second write amplifier are connected to a common input/output terminal.

12. The semiconductor memory device of claim 9, wherein:

when memory cells of said first memory cell array are replaced with memory cells of said redundancy memory cell array, data of said redundancy memory cells is controlled to be transmitted through a bus common to said first memory cell array and said redundancy memory cell array, and when memory cells of said second memory cell array are replaced with memory cells of said redundancy memory cell array, data of said redundancy memory cells is controlled to be transmitted through a bus common to said second memory cell array and said redundancy memory cell array.

13. The semiconductor memory device of claim 9, wherein:

when memory cells of said first memory cell array are replaced with memory cells of said redundancy memory cell array, data of said redundancy memory cells is controlled to be transmitted through a bus common to said first memory cell array, said second memory cell array, and said redundancy memory cell array, and when memory cells of said second memory cell array are replaced with memory cells of said redundancy memory cell array, data of said redundancy memory cells is controlled to be transmitted through said bus common to said first memory cell array, said second memory cell array, and said redundancy memory cell array.

14. The semiconductor memory device of claim 13, wherein:

said redundancy memory cell array is located intermediate said first memory cell array and said second memory cell array.

15. A method for relieving defective memory cells in a semiconductor device, comprising the steps of:

providing a redundancy memory cell array corresponding to a plurality of memory cell arrays, providing each of the plural memory cell arrays with plural memory cell groups connected to a local bus line, the local bus lines of each memory cell groups being switchable connected to a memory cell array global bus line;

providing a bus switching control connected to the memory cell array global bus line corresponding to each of the plural memory cell arrays and connected to the redundancy memory cell array via a redundancy memory cell array bus line; and transmitting data for one or more memory cells of said redundancy memory cell array via said redundancy memory cell array bus line in place of data for one or more defective memory cells in any of said plurality of memory cell arrays.

16. The method of claim 15, comprising the further step of:

providing the bus switching control with a data path to each input/output terminal, which data path is common for data of the redundancy memory cell array and data of at least one of the plural memory cell arrays.

17. The method of claim 15, comprising the further steps of:

determining whether an input column address coincides with a column address of a defective column of one of the plural memory cell arrays; and in the case where the input column address coincides with a defective column of one of the plural memory cell arrays, transmit data of the redundancy memory cell array in place of the data of said defective column through a bus common to the redundancy memory cell array and to the memory cell array corresponding to the defective column.

18. The method of claim 16, wherein the data path is provided common to the redundancy memory cell array and each of the plural memory cell arrays.

19. The method of claim 15, further comprising the step of positioning the redundancy cell array intermediate the memory cell arrays.

20. The method of claim 15, wherein:

the step of providing a bus switching control connected to the memory cell array global bus line corresponding to each of the plural memory cell arrays and connected to the redundancy memory cell array via a redundancy memory cell array bus line, includes providing a number of data and write amplifier units equal to the number of memory cell arrays, wherein each of the data and write amplifier units are connected to connected to the redundancy memory cell array via the redundancy memory cell array bus line.

* * * * *